United States Patent [19]

Takahashi

[11] Patent Number: 4,927,731
[45] Date of Patent: May 22, 1990

[54] LIGHT-SENSITIVE MATERIAL CONTAINING SILVER HALIDE, REDUCING AGENT, POLYMERIZABLE COMPOUND, AND POLAR COMPOUND

[75] Inventor: Ryuichi Takahashi, Kanagawa, Japan
[73] Assignee: Fuji Photo Film Co., Ltd., Kanagawa, Japan
[21] Appl. No.: 175,456
[22] Filed: Mar. 30, 1988
[30] Foreign Application Priority Data
  Mar. 30, 1987 [JP] Japan ................................ 62-77320
  Apr. 10, 1987 [JP] Japan ................................ 62-87998
[51] Int. Cl.$^5$ ........................ G03C 1/68; G03C 1/72
[52] U.S. Cl. .................................. 430/138; 430/203; 430/617; 430/955
[58] Field of Search ................ 430/138, 203, 617, 955

[56] References Cited

U.S. PATENT DOCUMENTS

| | | | |
|---|---|---|---|
| 3,667,959 | 6/1972 | Bojara et al. | 430/570 |
| 4,624,910 | 11/1986 | Takeda | 430/203 |
| 4,629,676 | 12/1986 | Hayakawa et al. | 430/203 |
| 4,649,098 | 3/1987 | Takeda | 430/270 |
| 4,758,496 | 7/1988 | Kakimi | 430/138 |

FOREIGN PATENT DOCUMENTS 203613 12/1986 European Pat. Off. .

Primary Examiner—Paul R. Michl
Assistant Examiner—Patrick Doody
Attorney, Agent, or Firm—Sughrue, Mion, Zinn, MacPeak & Seas

[57] ABSTRACT

A light-sensitive material comprises a support and a light-sensitive layer containing silver halide, a reducing agent, a polymerizable compound and a base or base precursor. The silver halide, reducing agent and polymerizable compound are contained in microcapsules which are dispersed in the light-sensitive layer. The base or base precursor is arranged outside of the microcapsules. The light-sensitive layer further contains a polar compound having a melting point in the range of 30° to 250° C., which is arranged outside of the microcapsules. The polar compound may be arranged inside and outside of the microcapsules.

8 Claims, No Drawings

LIGHT-SENSITIVE MATERIAL CONTAINING SILVER HALIDE, REDUCING AGENT, POLYMERIZABLE COMPOUND, AND POLAR COMPOUND

FIELD OF THE INVENTION

This invention relates to a light-sensitive material which comprises a support and a light-sensitive layer containing silver halide, a reducing agent and a polymerizable compound.

BACKGROUND OF THE INVENTION

A light-sensitive material which comprises a support and a light-sensitive layer containing silver halide, a reducing agent and a polymerizable compound can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publications Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed.

The above-mentioned image forming methods are based on the principle in which the polymerizable compound is polymerized within the area where a latent image of the silver halide has been formed.

Japanese Patent Provisional Publication No. 61(1986)-260241 describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

The polymerization reaction in the image forming method smoothly proceeds under alkaline conditions. Therefore, a base or base precursor is preferably contained in the light-sensitive layer. Examples of the base and base precursor are described in Japanese Patent Provisional Publications Nos. 61(1986)-69062, 61(1986)-73145 and 61(1986)-260241. However, where the light-sensitive layer contains a base or a base precursor in the light-sensitive layer (particularly when the base is contained), the sensitivity of the light-sensitive material tends to decrease or the material tends to be fogged in the course of the storage.

In order to eliminate the above-mentioned problem, the base or base precursor may be separated from the other components of the light-sensitive layer, and the base or base precursor may be brought into contact with the others in a development process. An example of the light-sensitive material employing a separating means is described in Japanese Patent Provisional Publication No. 62(1987)-209523. In the light-sensitive material, the components of the light-sensitive layer, such as silver halide, a reducing agent and a polymerizable compound is contained in microcapsules to form light-sensitive microcapsules, and the base or base precursor is arranged outside of the light-sensitive microcapsules. The light-sensitive material employing the microcapsules has other advantages in that the sharpness of an image is improved and a clear image can be obtained.

SUMMARY OF THE INVENTION

The present inventor has found that the base or a base formed from the base precursor does not efficiently function in the above-mentioned light-sensitive material when the base or base precursor is arranged outside of the microcapsules, though such light-sensitive material has an excellent storage stability. According to study of the present inventor, a large portion of the base or a base formed from the base precursor does not penetrate into the microcapsules in a development process, if the base or base precursor is arranged outside of the microcapsules.

An object of the present invention is to provide a light-sensitive material which gives an improved clear image in the development process without disturbing to the excellent strage stability of the light-sensitive material having such a structure that the base or the base precursor is arranged outside of the microcapsules.

There is provided by the present invention a light-sensitive material comprising a support and a light-sensitive layer containing silver halide, a reducing agent, a polymerizable compound and a base or base precursor, said silver halide, reducing agent and polymerizable compound being contained in microcapsules which are dispersed in the light-sensitive layer, and said base or base precursor being arranged outside of the microcapsules, wherein the light-sensitive layer contains a polar compound having a melting point in the range of 30° to 250° C., said polar compound being arranged outside of the microcapsules.

It is preferred that a shell material of the microcapsules, the polar compound and the base or a base formed from the base precursor have inorganic character/organic character values satisfying the condition of the formula (VII) OR (VIII):

$$A < B < C \tag{VII}$$

$$C < B < A \tag{VIII}$$

in which A represents the inorganic character/organic character value of the shell material of the microcapsules; B represents the inorganic character/organic character value of the polar compound; and C represents the inorganic character/organic character value of the base or a base formed from the base precursor.

There is further provided by the invention a light-sensitive material comprising a support and a light-sensitive layer containing silver halide, a reducing agent, a polymerizable compound and a base or base precursor, said silver halide, reducing agent and polymerizable compound being contained in microcapsules which are dispersed in the light-sensitive layer, and said base or base precursor being arranged outside of the microcapsules, wherein the light-sensitive layer contains a polar compound having a melting point in the range of 30° to 250° C., said polar compound being arranged inside and outside of the microcapsules.

It is preferred that the reducing agent, the polar compound contained in the microcapsules, the polar compound arranged outside of the microcapsules and the base or a base formed from the base precursor have pKa values satisfying the conditions of the formulas (V) and (VI):

$$D \leq E \leq G \qquad (V)$$

$$D \leq F \leq G \qquad (VI)$$

in which D represents the pKa value of the reducing agent; E represents the pKa value of the polar compound contained in the microcapsules; F represents the pKa value of the polar compound arranged outside of the microcapsules; and G represents the pKa value of the base or a base formed from the base precursor.

The light-sensitive material of the invention, the light-sensitive layer contains a polar compound having a melting point in the range of 30° to 250° C., which is arranged outside of the microcapsules.

The present inventor has found that the polar compound arranged outside of the microcapsules functions as a medium of the base or a base formed from the base precursor (hereinafter sometimes referred to simply as base) in a heat development process. Accordingly, the polar compound accelerates the penetration rate of the base into a shell material of the microcapsule. Therefore, in the light-sensitive material of the present invention, the base smoothly penetrates into the microcapsules, so that a polymerization reaction in the area where a latent image of the silver halide has been formed (or in the area where a latent image of the silver halide has not been formed) proceeds smoothly. Since the polar compound scarcely functions at room temperature (i.e., during strage) because its melting point is higher than the room temperature, the excellent strage stability of the light-sensitive material does not decrease.

As mentioned above, the light-sensitive material of the present invention gives a clear image, even if the material is preserved for a long term or under severe conditions.

Further, the present inventor has found that when the polar compound has an inorganic character/organic character values satisfying the relation of the formula (VII) or (VIII), the penetration rate of the base into a shell material of the microcapsule is much accelerated. Therefore, when a compound having the value is used as the polar compound, the polymerization reaction proceeds more smoothly.

Furthermore, the present inventor has found that when the microcapsules further contains the polar compound having a melting point in the range of 30° to 250° C., the penetration rate of the base into a shell material of the microcapsule is also much accelerated. Therefore, when a polar compound is contained in the microcapsules as well as the compound arranged outside of the microcapsules, the polymerization reaction proceeds more smoothly.

Furthermore, the present inventor has found that when the polar compound contained in the microcapsules and the polar compound arranged outside of the microcapsules have pKa values of E and F, respectively, satisfying the relationships of the formulas (V) and (VI), the development remarkably accelerates. It is believed that in addition to the penetration of the base into the microcapsule, the reducing agent is activated by electron transfer from the base to the reducing agent through the polar compounds having the pKa values (proton transfer from the reducing agent to the base via the polar compounds) in a heat development process. Therefore, when the compounds having the pKa values are used as the polar compounds, the polymerization reaction proceeds still more smoothly.

DETAILED DESCRIPTION OF THE INVENTION

In the light-sensitive material of the present invention, the light-sensitive layer contains a polar compound (i.e., a compound having a polar group) having a melting point in the range of 30° to 250° C., which is arranged outside of the microcapsules. The microcapsules may independently contain a polar compound having a melting point in the range of 30° to 250° C. In the case that the microcapsules contains a polar compound, the polar compound contained in the microcapsules may be different from the polar compound arranged outside of the microcapsules. The term of "polar compound arranged inside of the microcapsules (or polar compound contained in the microcapsules)" used in the present specification means the polar compound contained in a core material of the microcapsules and/or a shell material of the microcapsules. Further, the term of "polar compound arranged outside of the microcapsules" used in the present specification means the polar compound deposited on the surface of the microcapsules and/or separated from the microcapsules in the light-sensitive layer.

There is no specific limitation with respect to the polar compound, so long as the polar compound has a polar group and a melting point in the range of 30° to 250° C. The polar compound preferably has a melting point in the range of 50° to 150° C.

There is no specific limitation with respect to the polar group of the polar compound. Preferred examples of the polar compounds include carboxylic acid amide derivative, a sulfonamide derivative, a phosphoric acid amide derivative, a ketone, an ester, an ether, an urea derivative, an urethane and a compound having hydroxyl group. Among them, a carboxylic acid amide derivative and an urea derivative are more preferred as a polar compound arranged outside of the microcapsules. Further, a sulfonamide derivative is most preferred as a polar compound contained in the microcapsules.

Concrete examples of the polar compound having a melting point in the range of 30° to 250° C. are described below. The following value in the parentheses means the inorganic character/organic character value of the compound.

(A) polyhydroxy compounds such as sorbitol (5), dulcitol (5), pentaerythrithol (5), trimethylolethane (3), hexanediol (1.7), cyclohexanediol (1.8), saponin (3-5), vanillin (1.3), decanediol (1) and xylose (4.3);
(B) amide compounds such as acetamide (3.4), propionamide (3.4), toluenesulfonamide (1.4) and benzamide (1.1); and
(C) urea compounds such as methylurea (5.5), ethylurea (3.7), 1,3-dimethylurea (3.7), n-butylurea (2.2), dimethylol urea (7.0), tetramethylurea (2.2), phenylurea (1.6), benzoylurea (2.1) and 1,1-diethylurea (2.2).

Examples of other compounds (including those classified into the above (A) to (C) groups) include compounds having the following formulas (1) to (38).

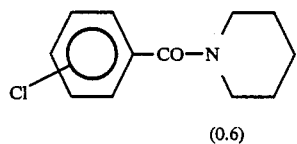

(1)

(0.6)

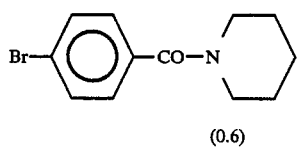

(2)

(0.6)

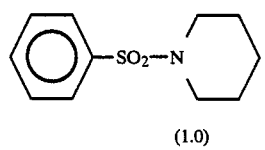

(3)

(1.0)

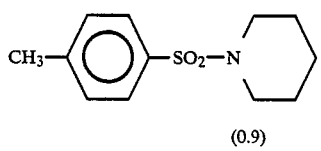

(4)

(0.9)

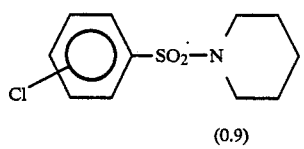

(5)

(0.9)

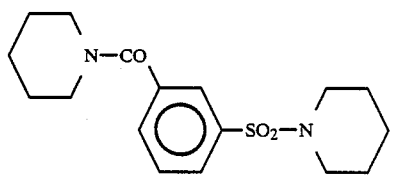

(6)

(0.9)

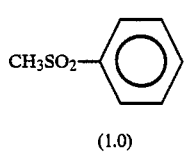

(7)

(1.0)

-continued

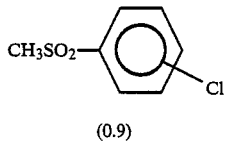

(8)

(0.9)

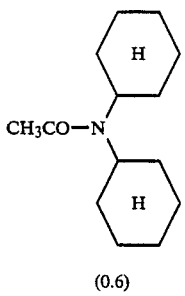

(9)

(0.6)

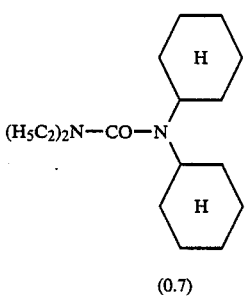

(10)

(0.7)

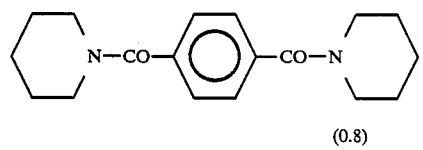

(11)

(0.8)

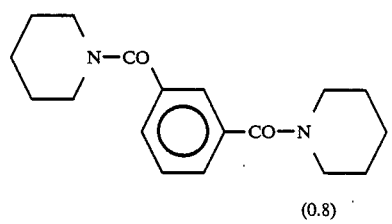

(12)

(0.8)

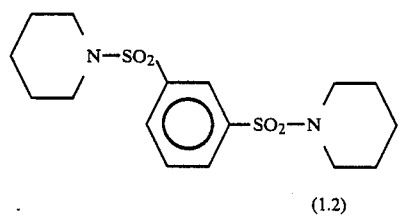

(13)

(1.2)

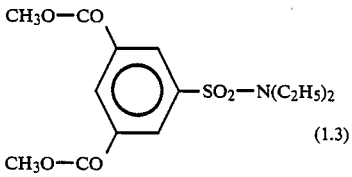

(14)

(1.3)

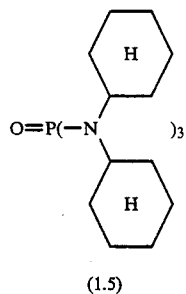
(1.5)
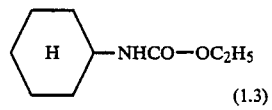
(1.3)
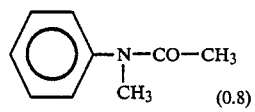
(0.8)
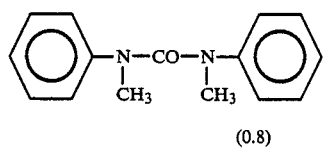
(0.8)
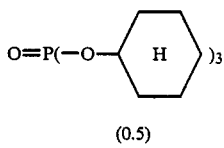
(0.5)
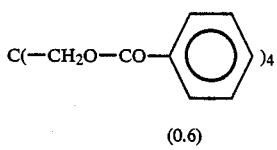
(0.6)
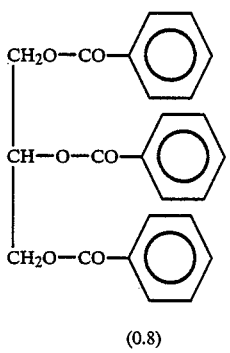
(0.8)
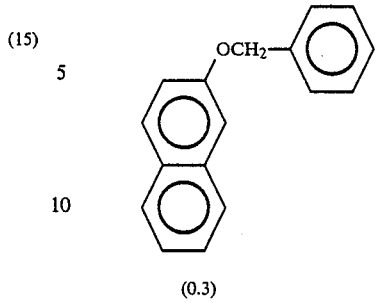
(0.3)
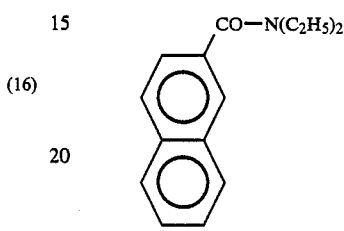
(0.7)
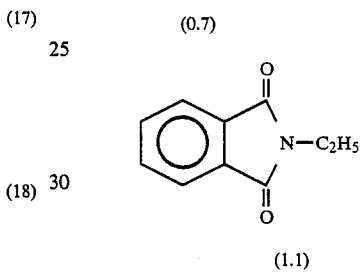
(1.1)
$H_2N-SO_2-N(C_3H_7)_2$ (25)
(1.9)
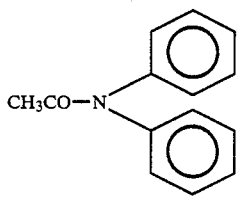
(0.6)
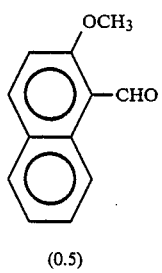
(0.5)
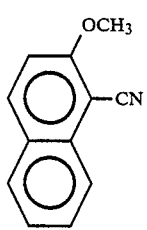
(0.4)

-continued

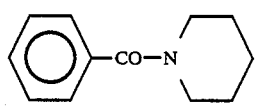

(0.7)

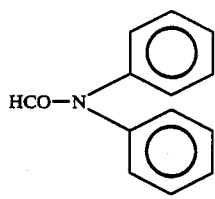

(0.6)

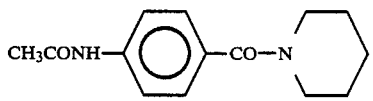

(1.0)

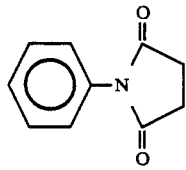

(0.5)

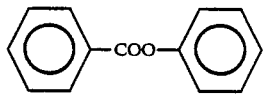

(0.4)

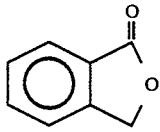

(0.6)

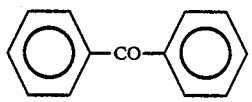

(0.4)

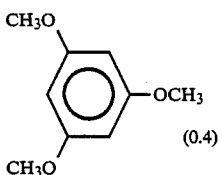

(0.4)

n-C₁₆H₃₃OH (0.3)

-continued n-C$_{18}$H$_{37}$OH (31)

(0.3)

In the light-sensitive material of the invention, a sulfonamide derivative is preferred as the polar compound contained in the microcapsule. The sulfonamide derivative can be represented by the following formula (I):

$$R^3-SO_2N\begin{matrix}R^1\\ \\R^2\end{matrix}$$ (I)

in which each of $R^1$ and $R^2$ independently is a monovalent group selected from the group consisting of hydrogen, an alkyl group, a cycloalkyl group, an aryl group, an aralkyl group and a heterocyclic group, each of which may have one or more substituent groups, or $R^1$ and $R^2$ may be combined together with nitrogen atom to form a nitrogen-containing heterocyclic ring; and $R^3$ is a monovalent group selected from the group consisting of an alkyl group, a cycloalkyl group, an alkenyl group, an alkinyl group, an amino group, an aryl group, an aralkyl group and a heterocyclic group, each of which may have one or more substituent groups.

The compounds where at least one of $R^1$ and $R^2$ is hydrogen are preferred. The compounds where each of $R^1$ and $R^2$ is hydrogen are most preferred. The most preferred sulfonamide derivatives can be represented by the following formula (II):

$$R^4-SO_2NH_2$$ (II)

in which $R^4$ is a monovalent group selected from the group consisting of an alkyl group, a cycloalkyl group, an alkenyl group, an alkinyl group, amino, an aryl group, an aralkyl group and a heterocyclic group, each of which may have one or more substituent groups.

The alkyl group represented by $R^1$ and $R^2$ may be a straight chain or a branched chain. The alkyl group may preferably have up to 30 carbon atoms and may have one or more substituent groups such as an alkoxy group (e.g., methoxy group), hydroxyl, cyano, a halogen atom and a sulfonamide group. These substituent groups may further have one or more substituent groups. Examples of the alkyl groups (including substituted alkyl groups) include methyl, ethyl, isopropl, butyl, isobutyl, heptyl, octyl, dodecyl, headecyl, 2-hydroxyethyl, p-tolylsulfonylaminoethyl and 4-(N,N-dimethyl-sulfamoyl)aminobutyl.

The cycloalkyl group represented by $R^1$ and $R^2$ preferably has 5 to 20 carbon atoms and may have one or more substituent groups such as alkoxy (e.g., methoxy), hydroxy, cyano, a halogen atom and a sulfonamide group. An example of the cycloalkyl group is cyclohexyl.

The aryl group represented by $R^1$ and $R^2$ preferably has 6 to 30 carbon atoms and may have one or more substituent groups such as an alkyl group (e.g., methyl), cyano, nitro and a halogen atom. These substituent groups may further have one or more substituent groups. Examples of the aryl group (including substituted aryl group) include phenyl, p-dodecylphenyl, p-butoxyphenyl, p-sulfamoylphenyl, p-hexadecyloxyphenyl, p-(N,N-dimethylsulfamoyl)aminophenyl, p- cyanophenyl, p-palmitoylaminophenyl and p-dodecylsulfonylaminophenyl.

The aralkyl group represented by $R^1$ and $R^2$ preferably has 7 to 30 carbon atoms and may have one or more substituent groups such as an alkyl group (e.g., methyl), cyano, nitro and a halogen atom. An example of the aralkyl group is benzyl.

The heterocyclic ring represented by $R^1$ and $R^2$ preferably has 6 to 30 carbon atoms and may have one or more substituent groups such as an alkyl group (e.g., methyl), cyano, nitro and halogen. Examples of the heterocyclic ring include pyridyl, furyl, thienyl, quinolyl, thiazolyl and benzothiazolyl.

Each of $R^1$ and $R^2$ may be combined together with neighboring nitrogen atom to form a nitrogen-containing heterocyclic ring. The heterocyclic ring composed of $R^1$, $R^2$ and nitrogen atom is preferably a 5- or 6-membered heterocyclic group which has one or more substituent group such as an alkyl group (e.g., methyl), cyano, nitro and a halogen atom. Examples of the heterocyclic group include piperidino, pyrrolidino, morpholino, 4-dodecylsulfonylpiperazino, 4-(N,N-diisopropylsulfamoyl)piperazino and indolyl.

The alkyl group represented by $R^3$ preferably has 4 to 30 carbon atoms. Examples of the alkyl group include an alkoxy group (e.g., methoxy group), hydroxy, cyano, a halogen atom and a sulfonamide compound.

An examples of the cycloalkyl group represented by $R^3$ is cyclohexyl.

The alkenyl group represented by $R^3$ preferably has 4 to 30 carbon atoms and may have one or more substituent groups such as an alkoxy group (e.g., methoxy), hydroxy, cyano, a halogen atom and a sulfonamide group. An example of the alkenyl group is $C_8H_{17}CH=(CH_2)_7-$.

The alkinyl group represented by $R^3$ preferably has 4 to 30 carbon atoms and may have one or more substituent groups such as an alkoxy group (e.g., methoxy), hydroxy, cyano, a halogen atom and a sulfonamide group. An example of the alkinyl group is $CH\equiv C-(CH_2)_8-$.

Concrete examples of the sulfonamide derivatives having the formula (I) where $R^3$ is an alkyl group, a cycloalkyl group, an alkenyl group or an alkinyl group (an aliphatic group) are described hereinbelow.

$C_7H_{15}SO_2NH_2$ (101)
$C_8H_{17}SO_2NH_2$ (102)
$C_{12}H_{25}SO_2NH_2$ (103)
$C_{16}H_{33}SO_2NH_2$ (104)

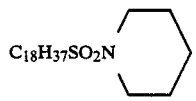
(105)

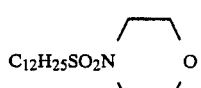
(106)

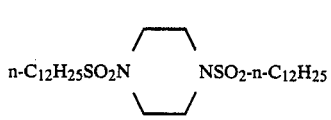
(107)

—$SO_2NH_2$ (108)

$H_2NSO_2-(CH_2)_4-SO_2NH_2$ (109)

The compounds having the formula (I) where $R^3$ is amino group or a substituted amino group are most preferred. The sulfonamide derivatives where $R^3$ is amino group or a substituted amino group can be represented by the following formula (III):

$$\begin{array}{c} R^8 \diagdown \phantom{NSO_2N} \diagup R^5 \\ NSO_2N \\ R^7 \diagup \phantom{NSO_2N} \diagdown R^6 \end{array} \quad (III)$$

in which each of $R^5$, $R^6$, $R^7$ and $R^8$ is a monovalent group selected from the group consisting of hydrogen, an alkyl group, a cycloalkyl group, an aryl group, an aralkyl group and a heterocyclic group and each of which may have one or more substituent groups.

Examples of the groups represented by each of $R^5$, $R^6$, $R^7$ and $R^8$ include those which are above described each group in $R^1$ and $R^2$.

$R^5$ and $R^6$ and/or $R^7$ and $R^8$ may be combined together with neighboring nitrogen atom to form a nitrogen-containing heterocyclic ring (described hereinafter).

It is preferred that at least one of $R^5$, $R^6$, $R^7$ and $R^8$ is hydrogen. The compounds where either $R^5$ and $R^6$ is hydrogen, or $R^7$ and $R^8$ are hydrogen, are most preferred. The most preferred sulfonamide derivatives can be represented by the following formula (IV):

$$H_2NSO_2N \diagup^{R^9}_{\diagdown R^{10}} \quad (IV)$$

in which $R^9$ and $R^{10}$ are the same as those set forth in $R^5$ to $R^8$ of the formula (III).

Concrete examples of the sulfonamide derivatives having the formula (II) described hereinbelow.

| | |
|---|---|
| $H_2NSO_2NH$ | (121) |
| $H_2NSO_2NHCH_3$ | (122) |
| $H_2NSO_2NHC_2H_5$ | (123) |
| $H_2NSO_2NH$-n-$C_3H_7$ | (124) |
| $H_2NSO_2NH$-i-$C_3H_7$ | (125) |
| $H_2NSO_2NH$-n-$C_4H_9$ | (126) |
| $H_2NSO_2NH$-i-$C_4H_9$ | (127) |
| $H_2NSO_2NH$-s-$C_4H_9$ | (128) |
| $H_2NSO_2NH$-t-$C_4H_9$ | (129) |
| $H_2NSO_2NHC_5H_{11}$ | (130) |
| $H_2NSO_2NHC_6H_{13}$ | (131) |
| $H_2NSO_2NHC_8H_{17}$ | (132) |
| $H_2NSO_2N(CH_3)_2$ | (133) |
| $H_2NSO_2N(C_2H_5)_2$ | (134) |
| $H_2NSO_2N$(n-$C_3H_7)_2$ | (135) |
| $H_2NSO_2N$(i-$C_3H_7)_2$ | (136) |
| $H_2NSO_2N$(n-$C_4H_9)_2$ | (137) |
| $H_2NSO_2N$(n-$C_8H_{17})_2$ | (138) |
| $CH_3NHSO_2NHCH_3$ | (139) |
| $CH_3NHSO_2N(CH_3)_2$ | (140) |
| $(CH_3)_2NSO_2N(CH_3)_2$ | (141) |
| $(C_2H_5)_2NSO_2N(C_2H_5)_2$ | (142) |
| n-$C_{16}H_{33}NHSO_2N(CH_3)_2$ | (143) |
| n-$C_8H_{17}NHSO_2N$(i-$C_3H_7)_2$ | (144) |

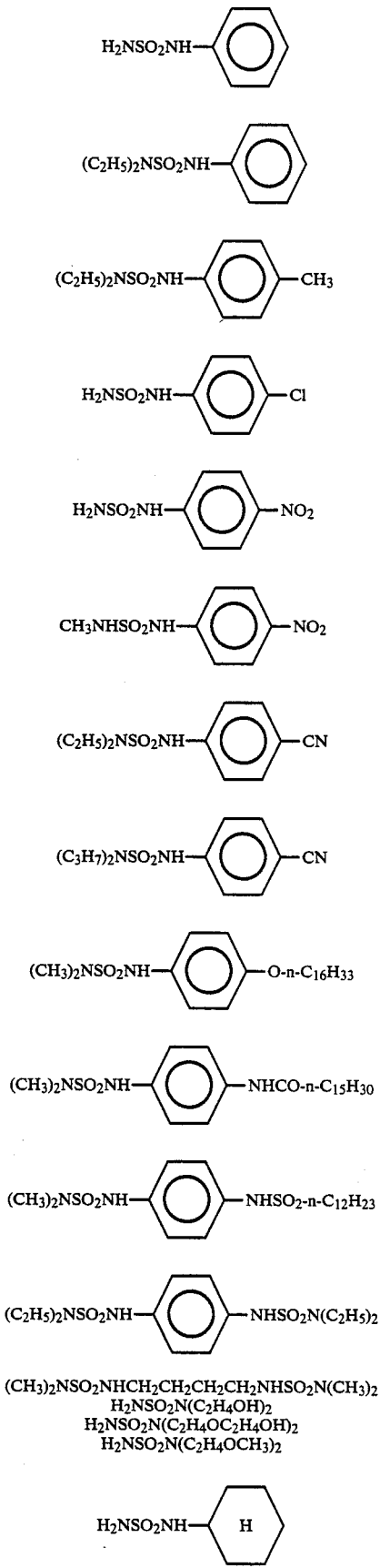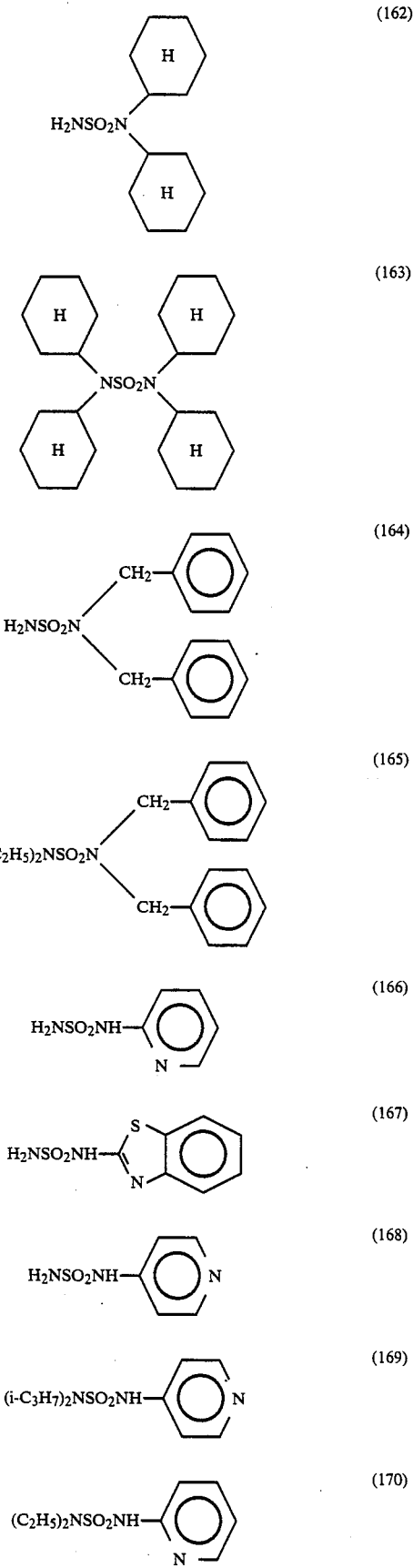

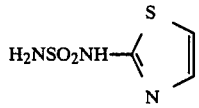 (171)

The compounds having the formula (I) where $R^3$ is an aryl group, an aralkyl group or a heterocyclic group, are most preferred.

Examples of each of the aryl group, the aralkyl group and the heterocyclic group are the same as those set forth in $R^1$ and $R^2$. The heterocyclic group may be the same as those set forth in the heterocyclic ring composed of $R^1$, $R^2$ and nitrogen atom.

Among the compounds where $R^3$ is an aryl group, an aralkyl group or a heterocyclic group, the compounds where $R^1$ and $R^2$ are hydrogen and $R^3$ is an aryl group or a heterocyclic group are more preferred.

Concrete examples of the sulfonamide derivatives having the formula (I) where $R^3$ is an aryl group, an aralkyl group or a heterocyclic ring are described hereinbelow. Among them, the formulas (231) to (294) are concrete examples of the compounds where $R^3$ is an aryl group or a heterocyclic ring.

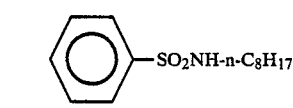 (201)

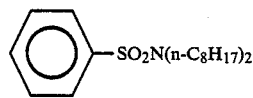 (202)

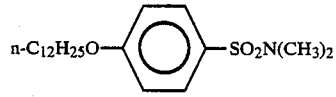 (203)

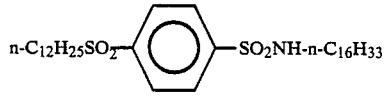 (204)

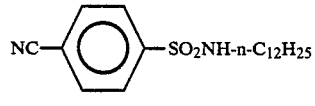 (205)

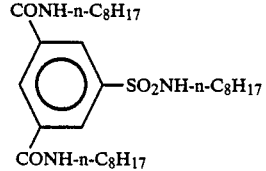 (206)

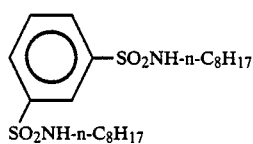 (207)

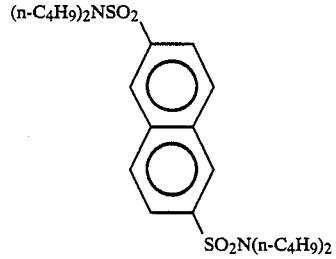 (208)

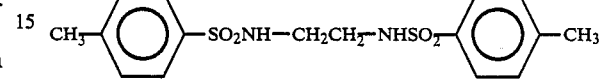 (209)

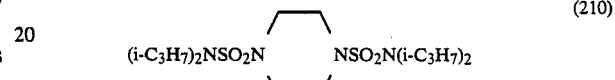 (210)

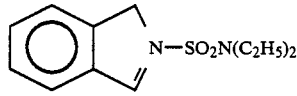 (211)

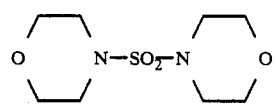 (212)

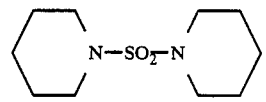 (213)

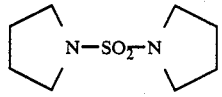 (214)

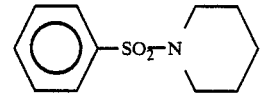 (215)

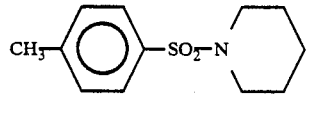 (216)

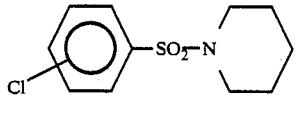 (217)

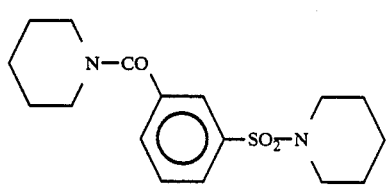 (218)

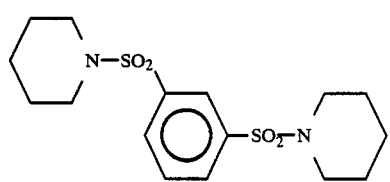 (219)
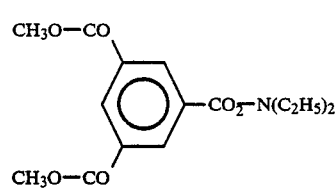 (220)
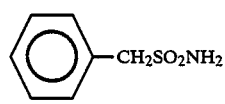 (221)
 (222)
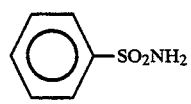 (231)
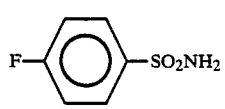 (232)
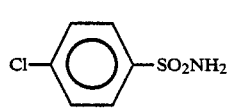 (233)
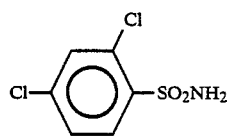 (234)
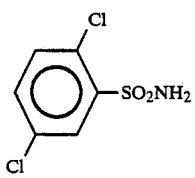 (235)
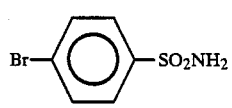 (236)
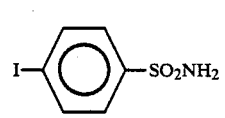 (237)
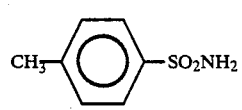 (238)
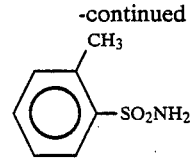 (239)
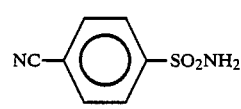 (240)
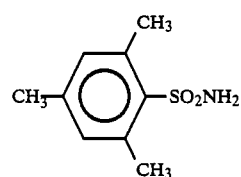 (241)
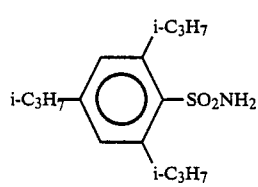 (242)
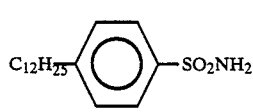 (243)
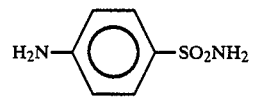 (244)
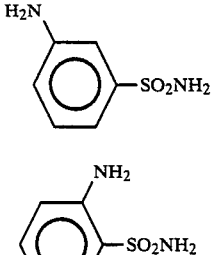 (245)
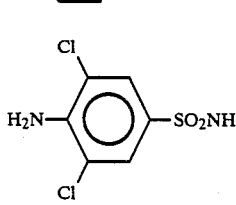 (246)
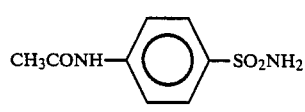 (247)
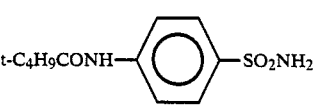 (248)
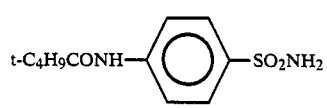 (249)

-continued
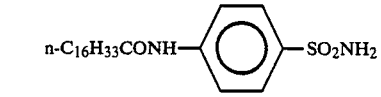 (250)
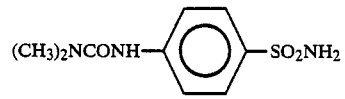 (251)
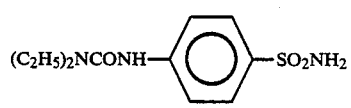 (252)
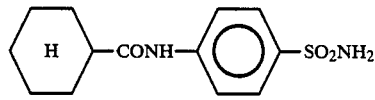 (253)
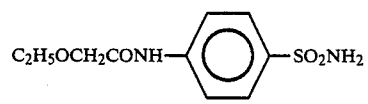 (254)
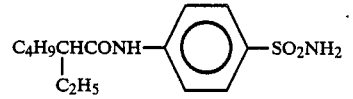 (255)
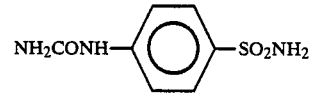 (256)
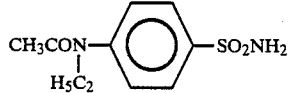 (257)
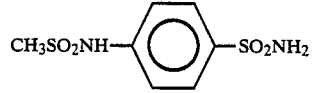 (258)
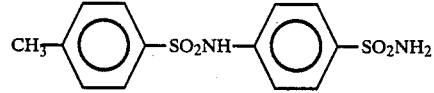 (259)
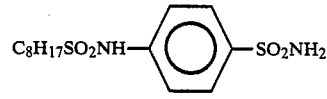 (260)
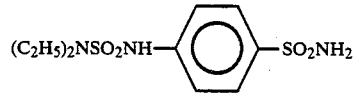 (261)
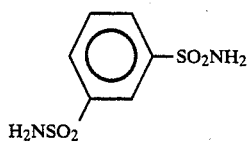 (262)
-continued
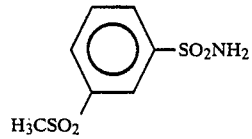 (263)
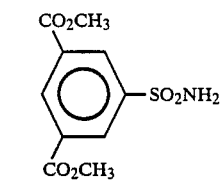 (264)
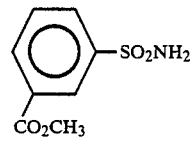 (265)
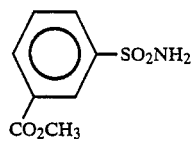 (266)
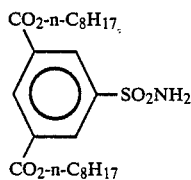 (267)
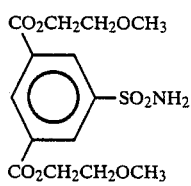 (268)
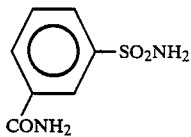 (269)
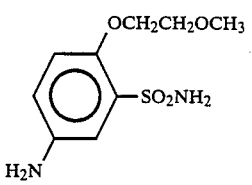 (270)
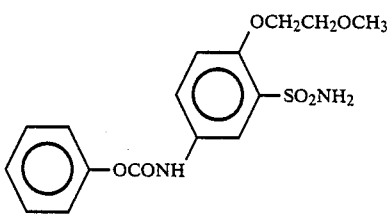 (271)

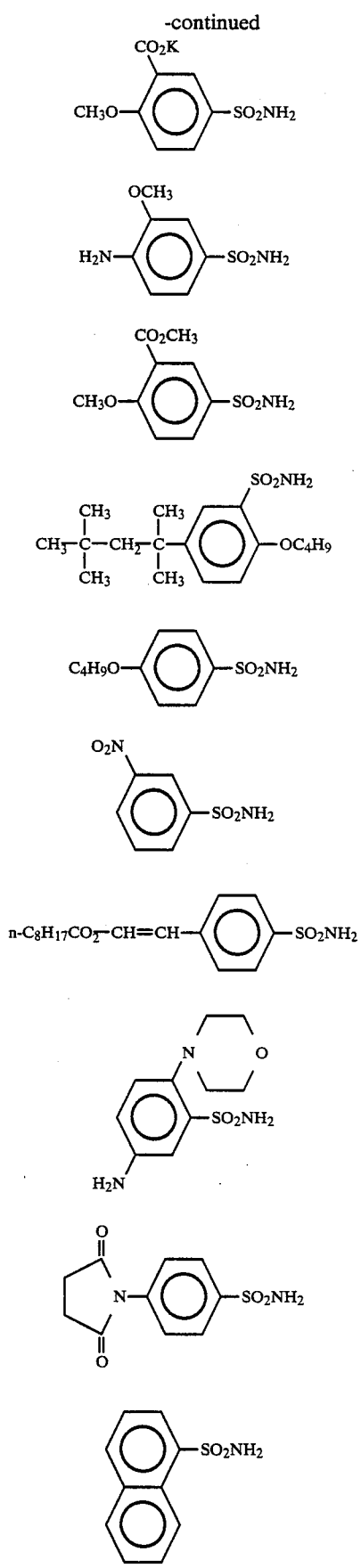
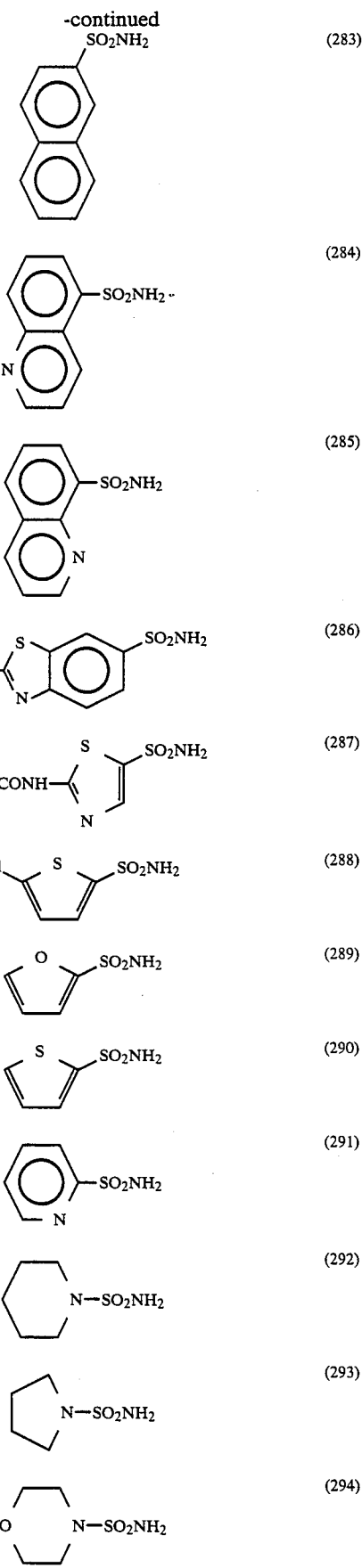

Most of the sulfonamide derivatives are known and can be easily synthesized by methods described in "New Experimental Chemical Lecture, Synthesis and Reaction (III) of Organic Compounds", pp. 1,803-1,807 (edited by Nippon Chemical Society, 1978 published by Maruzen, written in Japanese) and G. A. Benson and W. J. Spiran, "Chemical Reviews, 80", pp. 151-186 (1980).

The polar compound can be used singly or in combination.

In the light-sensitive material of the present invention, the polar compound is preferably arranged outside of the microcapsules in the light-sensitive layer in the amount of 3 to 30 weight %, and more preferably 5 to 20 weight %.

In the light-sensitive material of the present invention, the hot-melt compound can be contained in the microcapsules in the amount of 0.2 to 0.5 mole based on 1 mole of the reducing agent.

It is preferred that the polar compound contained in the microcapsules and the polar compound arranged outside of the microcapsules in the light-sensitive layer, have the pKa values of E and F satisfying the relationships represented by the formulas (V) and (VI). The pKa values of each compound in the following formulas (V) and (VI) are values obtained by making measurement by using N,N-dimethyl-formamide (DMF) as a solvent.

$$D \leq E \leq G \quad \text{(V)}$$

$$D \leq F \leq G \quad \text{(VI)}$$

in which D represents pKa value of the reducing agent; E represents pKa value of the polar compound contained in the microcapsules; F represents pKa value of the polar compound arranged outside of the microcapsules in the light-sensitive layer; and G represents pKa value of the base or a base formed from the base precursor.

Accordingly, it is desirable that the types of the polar compound contained in the microcapsules the polar compound arranged outside of the microcapsules in the light-sensitive layer, are determined depending on the types of the reducing agent and the base or a base to be formed from the base precursor.

When the compounds having pKa values of E and F defined by the formulas (V) and (VI) are used as the polar compounds, the reducing agent can be activated during heat development by an electron transfer reaction from the base to the reducing agent (a proton transfer reaction from the reducing agent to the base) in addition to the penetration rate of the base into a shell material of the microcapsules.

The electron transfer reaction can be effected, even when the order of the pKa values of from D to G defined by the formulas (V) and (VI) is partially reversed. However, it is desirable that the order defined by the formulas (V) and (VI) is kept to allow the electron transfer reaction to proceed smoothly.

It is desirable that the values of E and F defined by the formulas (V) and (VI) are allowed to be E≦F. However, the relationship may be E>F, since the reaction between the polar compounds generally proceeds with chemical equilibrium.

In order to accelerate the penetration rate of the base into the shell material of the microcapsule, a compound having a value (B), as an inorganic character/organic character value, satisfying the relationship of the following formula (VII) or (VIII) may be used as the polar compound to be contained in the particles arranged outside of the microcapsules in the light-sensitive layer.

$$A < B < C \quad \text{(VII)}$$

$$C < B < A \quad \text{(VIII)}$$

in which A is the inorganic character/organic character value of the shell material of the microcapsule; and C is the inorganic character/organic value of the base or a base formed from the base precursor.

The present inventor has found that when a compound having a value (B), as an inorganic character/organic character value, satisfying the relationships of the formulas (VII) and (VIII) is used as the polar compound arranged outside of the microcapsules in the light-sensitive layer, the penetration rate of the base into the shell material of the microcapsule can be greatly accelerated.

Accordingly, it is preferred that the type of the polar compound arranged outside of the microcapsules in the light-sensitive layer is determined depending on the type of the shell material of the microcapsule and the type of the base or a base formed from the base precursor.

It is preferred that the inorganic character/organic character value of the polar compound arranged outside of the microcapsules in the light-sensitive layer is a value (B) satisfying the relationship of the following formula (IX) or (X).

$$\tfrac{2}{3}A + \tfrac{1}{3}C < B < \tfrac{1}{3}A + \tfrac{2}{3}C \quad \text{(IX)}$$

$$\tfrac{1}{3}A + \tfrac{2}{3}C < B < \tfrac{2}{3}A + \tfrac{1}{3}C \quad \text{(X)}$$

wherein A and B are as defined in the formulas (VII) and (VIII).

It is preferred that the inorganic character/organic character value (A) of the shell material of the microcapsule is a higher value than the inorganic character/organic character value (C) of the base or a base formed from the base precursor.

Namely, the inorganic character/organic character value of the polar compound arranged outside of the microcapsules in the light-sensitive layer is preferably a value satisfying the relationship of the formula (VII), more preferably a value satisfying the relationship of the formula (IX).

It is particularly preferred that the inorganic character/organic character value (A) of the shell material of the microcapsules is from 4 to 7, the inorganic character/organic character value (C) of the base or a base formed from the base precursor is from 0.2 to 1 and the inorganic character/organic character value (B) of the polar compound arranged outside of the microcapsule in the light-sensitive layer is from 2 to 5.

The above-described inorganic character/organic character value can be easily obtained by calculating the value of the inorganic character and the value of the organic character from the structural formula of each organic compound. The inorganic character and the organic character are described in the literature "The organic Conceptual Diagram, Foundation and Application I" by Yosio Koda, published by Sankyl Shuppan (1984) (written in Japanese).

Microcapsules containing the silver halide, the reducing agent and the polymerizable compound therein and the base or base precursor are described below.

In the light-sensitive material of the invention, the silver halide, reducing agent and polymerizable compound are contained in microcapsules to form light-sensitive microcapsules which are dispersed in the light-sensitive layer.

There is no specific limitation on shell material of the microcapsules, and various known materials such as polymers which are employed in the conventional microcapsules can be employed as the shell material. Examples of the shell material (the following value in the parentheses means the inorganic character/organic character value of the shell material) include polyamide resin and/or polyester resin (0.8–1.1), polyurea resin and/or polyurethane resin (1.6–2.8), aminoaldehyde resin (3.5–5.5), gelatin (3.3–5.0), epoxy resin (2.0–3.0), a complex resin comprising polyamide resin and polyurea resin (0.8–1.1), and a complex resin comprising polyurethane resin and polyester resin (1.0–3.0).

When a polyol is used as a component for the formation of the shell of the microcapsule as in the polyester resin or the polyurethane resin, or when a condensate having hydroxyl groups is formed as a precondensate in the formation of the shell of the microcapsule as in the amino-aldehyde resin, it is preferred to use the above-described sulfonamide derivative as the polar compound contained in the microcapsules. Namely, when hydroxyl groups are allowed to exist in the precondensate or the shell forming material of the microcapsule, part of the hydroxyl groups is reacted with the sulfonamide derivative as shown in the following reaction formula (XI).

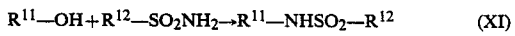

$$R^{11}\text{—OH} + R^{12}\text{—SO}_2\text{NH}_2 \rightarrow R^{11}\text{—NHSO}_2\text{—}R^{12} \qquad (XI)$$

In the formula (XI), $R^{11}$ is a residue of the precondensate having hydroxyl groups or the shell forming material having hydroxyl groups, and $R^{12}$ is as defined in $R^4$ of the formula (II).

Part of the hydroxyl groups in the precondensate or the shell forming material undergoes the reaction as shown in the formula (XI), so that a crosslinking ratio between molecules during the formation of the microcapsule shell is properly lowered and as a result, the plasticity of the microcapsule shell is improved. Accordingly, the penetration rate of the base into the shell material of the microcapsule can be greatly accelerated during heat development by the above reaction which takes place in the formation of the shell of the microcapsule.

A similar reaction takes place when there are used an isocyanate compound as the shell forming material of the microcapsule and a compound having hydroxyl group as the polar compound to be contained in the microcapsules.

In the case that the shell material is composed of a condensed aldehyde resin, the residual aldehyde preferably is not more than 5 mole based on 1 mole of the reducing agent.

The microcapsules which contains five or more silver halide grains are preferably more than 50% by weight based on the total amount of the microcapsules. The silver halide grains are preferably arranged in the shell material of the microcapsules.

Further, two or more kinds of the microcapsules differing from each other with respect to at least one of the silver halide, polymerizable compound and color image forming substance can be employed. Furthermore, three or more kinds of the microcapsules differing from each other with respect to the color image forming substance is preferably employed to form a full color image.

The mean size of the microcapsule preferably ranges from 0.5 to 50 μm, more preferably 1 to 25 μm, most preferably 3 to 20 μm. The amount of the microcapsules having a particle size of not larger than one sixth part of the average particle size preferably is not more than 1 volume % of the total amount of the microcapsules. Further, the amount of the microcapsules having a particle size of not smaller than twice as large as the average particle size is not more than 1 volume % of the total amount of the microcapsules. Further more, the proportion of an average thickness of the shell of the microcapsules to the average particle size preferably ranges from $0.5 \times 10^{-2}$ to $5 \times 10^{-2}$.

The mean grain size of the silver halide grains preferably is not more than the 5th part of the mean size of the microcapsules, more preferably is not more than 10th part. It is observed that when the mean size of the microcapsules is not less than 5 times as much as the mean grain size of silver halide grains, even and uniform image can be obtained.

In the light-sensitive material of the present invention, the base or the base precursor is contained in the light-sensitive layer without being contained in the microcapsules (arranged outside of the microcapsules). The base and the base precursor are described in more detail hereinbelow.

It is preferred that the base is an organic base. Inorganic bases are highly water soluble so that part of the base is liable to penetrate into the microcapsule during the preparation of the light-sensitive material. Accordingly, it is desirable that an organic base is used to completely separate the base from the components contained in the microcapsule and the improved the storage stability of the light-sensitive material.

Preferred examples of the organic bases (the following value in the parentheses means the inorganic character/organic character value of the organic base) include hydroxides of quaternary alkylammoniums (0.8–3.2), aliphatic amines (0.8–3.5) (e.g., trialkylamines (0.3–1.2), aliphatic polyamines (2.0–3.0)), aromatic amines (0.5–1.0) (e.g., N-alkyl-substituted aromatic amines (0.5–1.0), N-hydroxylalkyl-substituted aromatic amines (1.0–2.0) and bis[p-(dialkylamino)phenyl]methanes (0.5–0.8)), heterocyclic amines (0.8–1.6), amidines (2.0–3.0), cyclic amidines (1.0–1.9), guanidines (1.9–9.5), and cyclic guanidines (1.3–0.8). The base or a base formed from the base precursor preferably has a pKa of not less than 7.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckman rearrangement, and the like; and those capable of releasing bases by electrolysis. Preferred examples of the base precursors (the following value in the parentheses means the inorganic character/organic character value of the base formed from the base precursor) include guanidine trichloroacetate (9.5), piperidine trichloroacetate (0.8), morpholine trichloroacetate (1.3), p-toluidine trichloroacetate (0.6), 2-picoline trichloroacetate (0.7), guanidine phenylsulfonylacetate (9.5), guanidine 4-chlorophenylsulfonylacetate (9.5), guanidine 4-methyl-sulfonylphenylsulfonylacetate (9.5), and 4-acetylaminomethyl propionate (9.5).

These base or base precursors are preferably used in an amount of not more than 100% by weight, and more preferably from 0.1 to 40% by weight, based on the total solid content of the light-sensitive layer. These bases or base precursors can be used singly or in combination.

The light-sensitive microcapsules containing silver halide and the polymerizable compound, the reducing agent and the support which constitute the light-sensitive material of the invention are described below. Thus composed material is referred hereinafter to as "light-sensitive material".

There is no specific limitation with respect to silver halide contained in the light-sensitive layer of the light-sensitive material. Examples of the silver halides include silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tubular grain having an aspect ratio of not less than 3 can be used.

The silver halide grains preferably have such a relatively low tendency to be fogged that the amount of developed silver is not more than 5 weight % based on the total amount of silver when the unexposed silver halide grains are developed in 1 l of an aqueous developing solution containing 1.0 g of metol, 15.0 g of sodium sulfite, 4.0 g of hydroquinone, 26.7 g of sodium carbonate monohydrate and 0.7 g of potassium bromide.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 $\mu$m, more preferably 0.001 to 2 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has been formed is polymerized, hydrazines are preferably employed as the reducing agent. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (Jun. 1978), and Research Disclosure No. 17643, pp. 22-31 (Dec. 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5- di-t-pentylphenoxy)butyloyl}-2-(p-or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)-2-phenylhydrazine, 1-formyl-2-[4-{2-(2,4-di-tert-pentylphenoxy)butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-tritylhydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the image forming method of the invention, a polymerizable compounds having a relatively higher boiling point (e.g., 80° C. or higher) is preferably employed because it is hardly evaporated upon heating. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds. Further, in the case that a transferred image is formed on an image-receiving material, the polymerizable compound preferably has a viscosity of not lower than 100 cP at 25° C.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that a heat development is unilized in the use of the light-sensitive material, the support preferably is resistant to heat given in the processing stage. Examples of the material employable as the support include glass, paper, fine paper, coat paper, cast-coated paper, baryta paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610. A surface of a paper support preferably has a low water absorptiveness of not more than 3 g/m² which is a value measured according to Cobb test method. A surface of the paper support preferably has such a smooth surface that the smoothness value in terms of the Bekk Smoothness is not less than 300 seconds. A paper support preferably has a low shrinkage ratio of not more than 0.15% both in the machine direction and in the cross direction, wherein the shrinkage ratio is a value measured at the change of relative humidity from 75% to 60%. Further, a paper support preferably has a low air permeability of not less than 300 seconds, wherein the air permeability is a time required for 100 ml of air to pass through the paper support of an area of 645 mm² at pressure of 567 g. Furthermore, a paper support preferably has a pH value in the range of 5 to 9.

The light-sensitive layer can further contain optional components such as color image forming substances, sensitizing dyes, organic silver salts, radical generators, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, dyes having a property of being decolorized when it is heated or irradiated with light, matting agents, antismudging agents, plasticizers, water releasers, binders, photo polymerization initiator, solvent of the polymerizable compound and water soluble vinyl polymers.

The light-sensitive material containing the above-mentioned components can give a polymer image. When the light-sensitive material further contains a color image forming substance as an optional component, the material can give a color image.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substances) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or a dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter - Attractive Application and New Development as a Functional Coloring Matter", pp. 26–32 (Jun., 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that the developer is used, it is preferably used in an amount of from about 0.3 to about 80 parts by weight per one part by weight of the color former.

In the case that the color image forming substance comprises two components (e.g., color former and a developer), one component and the polymerizable compound is contained in the microcapsule, and the other component is arranged outside of the microcapsule in the light-sensitive layer, a color image can be formed on the light-sensitive layer.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

In the heat-development process, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mol., and preferably from 0.01 to 1 mol., per 1 mol. of the light-sensitive silver halide. Instead of the organic silver salt, an organic compound (e.g., benzotriazole) which can form an organic silver salt in combination with an inorganic silver salt can be added to the light-sensitive layer to obtain the same effect.

Examples of the radical generators include triazene-silver, silver diazotate and an azo compound.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into oils, surface active agents, compounds functioning as an antifogging agent and/or a development accelerator, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (including a cyclic amide compound), a thiourea derivative, a thioether compound, a polyethylene glycol derivative, a thiol derivative, an acetylene compound, a sulfonamide derivative and a quarternary ammonium salt.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The dyes or pigments can be contained in the light-sensitive layer for the purpose of anti-halation or anti-irradiation. Further, white pigments can be contained in the light-sensitive layer for the purpose of anti-halation or anti-irradiation.

The dyes having a property of being decolorized when it is heated or irradiated with light can be used in the light-sensitive material as a yellow filter layer in a conventional silver salt photographic system.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. When the microcapsule is employed in the light-sensitive material, the size of said particle preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat.

No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the light-sensitive microcapsule.

In the case that the water soluble vinyl polymer is is used, the polymers are preferably absorbed on the silver halide grains.

Examples and usage of the other optional components which can be contained in the light-sensitive layer are also described in the above-mentioned publications and applications concerning the light-sensitive material, and in Research Disclosure Vol. 170, No. 17029, pp. 9-15 (Jun. 1978). The light-sensitive layer preferably has a pH value of not more than 7.

Examples of auxiliary layers which are optionally arranged on the light-sensitive material include an image-receiving layer, a heating layer, an antistatic layer, an anticurl layer, a release layer, a cover sheet or a protective layer and an antihalation layer (colored layer).

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material. The details of the image-receiving layer will be described later.

Examples and usage of the other auxiliary layers are also described in the above-mentioned publications and applications concerning the light-sensitive material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

Preparations of liquid compositions and coating solutions of the components contained in the light-sensitive layer are described hereinbelow.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reveral emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethy cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced in the light-sensitive microcapsule, the emulsion of the organic silver salts can be prepared in the same manner as in the preparation of the silver halide emulsion.

In the preparation of the light-sensitive material, the polymerizable compound (the term, "polymerizable compound" includes the photo polymerizable composition and photo polymerizable compound) is used as the medium for preparation of the liquid composition containing another component of the light-sensitive layer. For example, the silver halide, (including the silver halide emulsion), the reducing agent, the photo polymerization initiator or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, —OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The polymerizable compound (including the light-sensitive composition) is preferably emulsified in an aqueous medium to prepare the coating solution. The necessary components for preparation of the microcapsule, such as shell material can be incorporated into the emulsion. Further, other components such as the reducing agent can be added to the emulsion. The emulsion of the polymerizable compound can be processed for forming shell of the microcapsule.

Examples of the process for preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using ureaformaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,979 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. No. 930,422; and the like. It is preferable, though not limitative, that the microcapsule is prepared by emulsifying core materials containing the polymerizable compound and forming a polymeric membrane (i.e., shell) over the core materials.

The polar compound and the base or base precursor can be added to the dispersion of the microcapsules to prepare a coating solution of the light-sensitive layer, so that these compounds are arranged outside of the microcapsules.

The light-sensitive material of the invention can be prepared by coating and drying the above-prepared coating solution on a support. The process for coating the coating solution on a support can be easily carried out in the conventional manner.

Use of the light-sensitive material is described below.

In the use of the light-sensitive material of the invention, a development process is conducted simultaneously with or after an imagewise exposure.

Various exposure means can be employed in the imagewise exposure, and in general, the latent image on the silver halide is obtained by imagewise exposure to radiation including visible light. The type of light source and exposure can be selected depending on the light-sensitive wavelengths (sensitized wavelength when seinsitization is carried out) or sensitivity of silver halide. Original image can be either monochromatic image or color image.

Development of the light-sensitive material can be conducted simultaneously with or after the image exposure. The development can be conducted using a developing solution in the same manner as the image forming method described in Japanese Patent Publication No. 45(1970)-11149. The image forming method described in Japanese Patent Provisional Publication No. 61(1986)-69062 which employs a heat development process has an advantage of simple procedures and short processing time because of the dry process. Thus, the latter method is preferred as the development process of the light-sensitive material.

Heating in the heat-development process can be conducted in various known manners. The heating layer which is arranged on the light-sensitive material can be used as the heating means in the same manner as the light-sensitive material described in Japanese Patent Provisional Publication No. 61(1986)-294434. The light-sensitive material is preferably heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minutes.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A polymer image can be formed on the light-sensitive layer in the above process. A color image can be obtained by fixing a dye or pigment on a polymer image.

Further, a color image can be formed on the light-sensitive material in which the light-sensitive layer contains a color former and a developer, one of them is together with the polymerizable compound contained in a microcapsule, and the other is arranged outside of the microcapsule.

The image can be also formed on the image-receiving material. The image-receiving material is described hereinbelow.

Examples of the material employable as the support of the image-receiving material include baryta paper in addition to various examples which can be employed as the support of the known light-sensitive material. In the case that a porous material, such as paper is employed as the support of the image-receiving material, the porous support preferably has such a surface characteristic that a filtered maximum waviness of not less than 4 $\mu$m is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing an image-receiving layer on the support. The image-receiving layer can be constructed according to the color formation system. In the cases that a polymer image is formed on the image-receiving material and that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. There is no specific limitation with respect to the thermoplastic compound. The thermoplastic compound include known plastic resin and wax. The thermoplastic resin preferably has a glass transition temperature of not more than 200° C. The wax preferably has a melting point of not more than 200° C.

A photopolymerization initiator or a thermalpolymerization initiator can be contained in the image-receiving layer to polymerize the transferred unpolymerized polymerizable compound, so that the obtained image is fixed on the image-receiving layer.

A dye or pigment can be contained in the image-receiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. In the case that it is possible that the dye or pigment disturbs the image formed on the image-receiving layer, it is preferred that the density of the dye or pigment is low (e.g. reflection density of not higher than 1), or the dye or pigment has a property of being decolored when it is heated or irradiated with light.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or locally contained in the image-receiving layer. For example, when the support is composed of transparent material, the white pigment can be partially contained in the image-receiving layer to make a part of a reflection image to be transparent. Thus, information of the image which is unnecessary in a transparent image can be entered in the part of the image-receiving layer containing the white pigment as the reflection image.

The image-receiving layer can be composed of two or more layers according to the above-mentioned functions. The thickness of the image-receiving layer preferably ranges from 1 to 100 $\mu$m, more preferably from 1 to 20 $\mu$m.

A protective layer can be provided on the surface of the image-receiving layer. A layer containing a granulated thermoplastic compound can be also provided on the image-receiving layer.

A layer containing an adhesive and a release paper can be provided in the order on the support of the image-receiving material on the opposite side of the image-receiving layer.

After the image exposure and/or the development process, pressing the light-sensitive material on the image-receiving material to transfer the unpolymerized polymerizable compound to the image-receiving material, a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material on the image-receiving material to transfer the color image forming substance in unfixed portion, a color image can be produced on the image-receiving material.

After the image is formed on the image-receiving material, the image-receiving material can be heated to polymerize the transferred unpolymerized polymerizable compound. By the above-mentioned process, the obtained image can be improved in the preservability.

Various image recording apparatus can be used for the image-forming method. An example of the apparatus comprises an exposure device for imagewize exposing the light-sensitive material to form a latent image, a heat development device for fixing the area corresponding to the latent image, a transfer device for pressing the developed light-sensitive material on the image-receiving material. Another example of the apparatus comprises an fixing apparatus for irradiating with light, pressing or heating the image-receiving material on which an image has been transferred in addition to the above-mentioned devices.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 1,200 ml of water were dissolved 25 g of gelatin and 1.5 g of sodium chloride, and the resulting gelatin solution was kept at 60° C. To the gelatin solution, 600 ml of an aqueous solution containing 117 g of potassium bromide and 600 ml of an aqueous solution containing 0.74 mole of silver nitrate were added simultaneously at the same feed rate over a period of 15 minutes.

The emulsion was washed for desalting, and then to the resulting emulsion was added 24 g of gelatin and stirred at 50° C. for 30 minutes to obtain a silver halide emulsion. Yield of the emulsion was 1,000 g.

Preparation of light-sensitive composition

In 100 g of trimethylolpropane triacrylate were dissolved 0.04 g of the following copolymer and 10.0 g of Pargascript Red I-6-B (tradename of Ciba-Geigy).

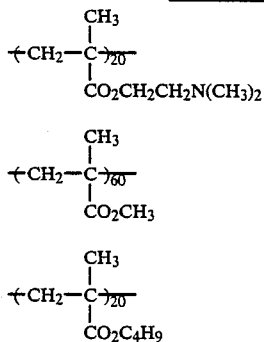
(Copolymer)

To 18.00 g of the solution were added 1.29 g of the following reducing agent (I), 1.22 g of the following reducing agent (II) and 0.20 g of 1% ethyl acetate solution of the following antifogging agent, 0.36 g of Emulex NP-8 (tradename of Nippon Emulsion Co., Ltd.) and 4.0 g of methylene chloride. The resulting mixture was made uniform.

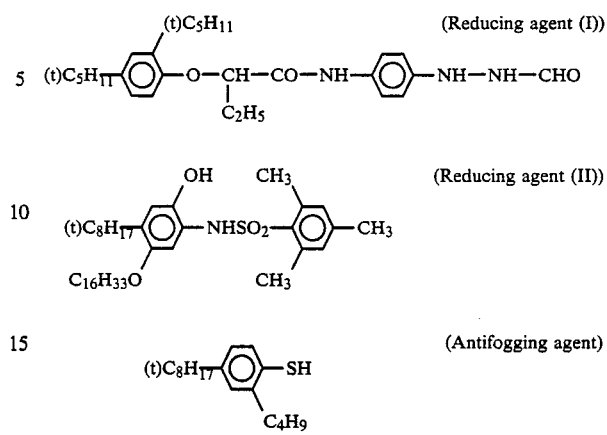

Further, to the resulting solution was added 4.0 g of the silver halide emulsion, and the mixture was stirred at 15,000 r.p.m. for 3 minutes to obtain a light-sensitive composition.

Preparation of light-sensitive microcapsule

To 10.51 g of 18.6% aqueous solution of Isobam (tradename of Kuraray Co., Ltd.) was added 48.56 g of 2.89% aqueous solution of pectin. After the solution was adjusted to a pH of 4.0 using 10% sulfuric acid, the light-sensitive composition was added to the resulting solution, and the mixture was stirred at 7,000 r.p.m. for 2 minutes to emulsify the light-sensitive composition in the aqueous medium.

To 72.5 g of the aqueous emulsion were added 8.32 g of 40% aqueous solution of urea, 2.82 g of 11.3% aqueous solution of resorcinol, 8.56 g of 37% aqueous solution of formaldehyde and 3.0 g of 8.0% aqueous solution of ammonium sulfate in this order, and the mixture was heated at 60° C. for 2 hours while stirring. After the mixture was adjusted to a pH of 7.3 using 10% aqueous solution of sodium hydroxide, 3.62 g of 30.9% aqueous solution of sodium hydrogen sulfite was added to the mixture to obtain a dispersion of light-sensitive microcapsules having a shell material made of amino-formaldehyde.

The inorganic character/organic character value of the shell material of the microcapsule was 5.0.

Preparation of dispersion of base precursor

To 176 g of 4% aqueous solution of polyvinyl alcohol (tradename PVA-217E, produced by Kuraray Co., Ltd.) was added 24 g of the following base precursor. The resulting solution was dispersed in Dynomill dispersing device to obtain a dispersion of solid particles of base precursor. The inorganic character/organic character value of the base (tricyclohexyl guanidine) formed from the base precursor was 0.6.

(Base precursor)

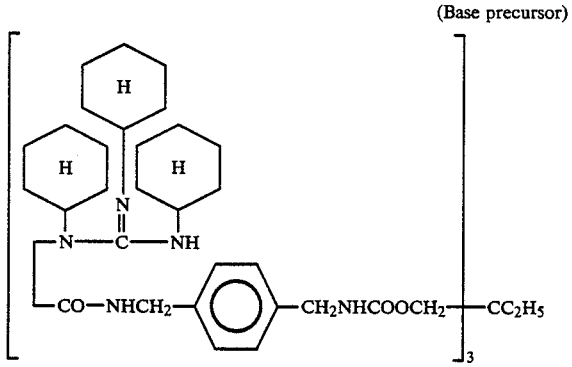

Preparation of light-sensitive material

To 10.0 g of the light-sensitive microcapsule dispersion were added 4.0 g of 5% aqueous solution of Emulex NP-8 (tradename of Nippon Emulsion Co., Ltd.), 10 g of the dispersion of solid particles of base precursor and 20 g of 20% aqueous solution of the p-toluene sulfonamide (polar compound; inorganic character/organic character value: 1.4), the mixture was coated on the polyethylene terephthalate film using a wire bar of #40 and dried at 40° C. for 30 minutes to obtain a light-sensitive material (A).

EXAMPLE 2

Preparation of light-sensitive material

Light-sensitive materials (B) to (F) were prepared in the same manner as in Example 1, except that acetoamide (for B; inorganic character/organic character value: 3.7), 1,3-dimethylurea (for C; 3.7), ethylurea (for D; 3.7), D(+)-xylose (for E; 4.3) and sorbitol (for F; 5) were respectively used in place of p-toluene sulfonamide. Each of the amounts of the polar compounds was the same as that of p-toluene sulfonamide.

COMPARISON EXAMPLE 1

Preparation of light-sensitive material

A light-sensitive material (X) was prepared in the same manner as in Example 1, except that 20 g of 20% aqueous solution of p-toluene sulfonamide was not used.

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. On a baryta paper was coated 10.5 g of the mixture using a wire bar of #40 and dried at 40° C. for 1 hour to obtain an image-receiving material.

Evaluation of light-sensitive material

Each of the light-sensitive materials prepared in Examples 1 and 2 and Comparison Example 1 was left at the temperature of 25° C. and in the humidity of 60%. After 1 day, each of the light-sensitive materials was imagewise exposed to light using a tungsten lamp at 5,000 lux for 1 second through a filter in which the density was continuously changing from 0 to 2.0, and then heated on a hot plate at 110° C. or 125° C. for 20 seconds or 40 seconds. Each of the exposed and heated light-sensitive materials was then combined with the image-receiving material and passed through press rolls at pressure of 500 kg/cm². The minimum density on the surface of the image-receiving material was measured using Macbeth's reflection densitometer.

Independently, each of the light-sensitive materials left at the temperature of 25° C. and in the humidity of 10%. An image was formed on the image-receiving material in the same manner as described above. The minimum density on the surface of the image-receiving material was measured using Macbeth's reflection densitometer.

The results are set forth in Tables 1 (preservation condition, temperature: 25° C., humidity: 60%) and 2 (preservation condition, temperature: 25° C., humidity: 10%).

In Tables 1 and 2, "I/O value" means the inorganic character/organic character value of the polar compound.

TABLE 1

| Light-sensitive material | I/O value | (Humidity: 60%) | | | |
|---|---|---|---|---|---|
| | | Heating 110° C. | | Heating 125° C. | |
| | | 20 sec. | 40 sec. | 20 sec. | 40 sec. |
| (A) | 1.4 | 0.90 | 0.77 | 0.11 | 0.08 |
| (B) | 3.4 | 0.39 | 0.11 | 0.07 | 0.05 |
| (C) | 3.7 | 0.37 | 0.10 | 0.06 | 0.05 |
| (D) | 3.7 | 0.27 | 0.09 | 0.06 | 0.05 |
| (E) | 4.5 | 0.41 | 0.16 | 0.09 | 0.07 |
| (F) | 5.0 | 0.88 | 0.80 | 0.10 | 0.08 |
| (X) | — | 0.94 | 0.81 | 0.12 | 0.05 |

TABLE 2

| Light-sensitive material | I/O value | (Humidity: 10%) | | | |
|---|---|---|---|---|---|
| | | Heating 110° C. | | Heating 125° C. | |
| | | 20 sec. | 40 sec. | 20 sec. | 40 sec. |
| (A) | 1.4 | 0.91 | 0.85 | 0.35 | 0.10 |
| (B) | 3.4 | 0.42 | 0.15 | 0.09 | 0.05 |
| (C) | 3.7 | 0.45 | 0.13 | 0.10 | 0.06 |
| (D) | 3.7 | 0.31 | 0.11 | 0.07 | 0.05 |
| (E) | 4.5 | 0.50 | 0.19 | 0.10 | 0.08 |
| (F) | 5.0 | 0.92 | 0.82 | 0.37 | 0.09 |
| (X) | — | 0.96 | 0.90 | 0.43 | 0.10 |

It is apparent from the results set forth in Table 1, the light-sensitive materials according to the present invention can accelerate the polymerization reaction in the developping process and give a clear image having a low minimum density. It is further apparent from the results set forth in Table 2, the same effect can be obtained in the case that the light-sensitive materials are preserved under the severe condition such as the low humidity and low temperature.

The light-sensitive materials (A) to (E) employing the polar compounds having the inorganic character/organic character values represented by the formula (VII) are more preferred, and the light-sensitive materials (B) to (D) employing the polar compounds having the inorganic character/organic character values represented by the formula (IX) are particularly preferred.

EXAMPLE 3

Preparation of silver halide emulsion

In 1,200 ml of water were dissolved 25 g of gelatin and 3 g of potassium bromide, and the resulting gelatin solution was kept at 70° C. To the gelatin solution, 600 ml of an aqueous solution containing 117 g of potassium bromide and 600 ml of an aqueous solution containing 0.74 mole of silver nitrate were added simultaneously at the same feed rate over a period of 45 minutes. To the resulting solution was further added 200 ml of an aqueous solution containing potassium iodide at the same feed rate over a period of 5 minutes to obtain an emulsion.

The emulsion was washed for desalting, and then to the resulting emulsion was added 24 g of gelatin and stirred at 50° C. for 15 minutes to obtain a silver halide emulsion. Yield of the emulsion was 1,000 g.

Preparation of W/O emulsion

In 100 g of trimethylolpropane triacrylate were dissolved 0.40 g of the following copolymer, 10.0 g of Pargascript Red I-6-B (tradename of Ciba Geigy) and 0.43 g of the following polar compound (a).

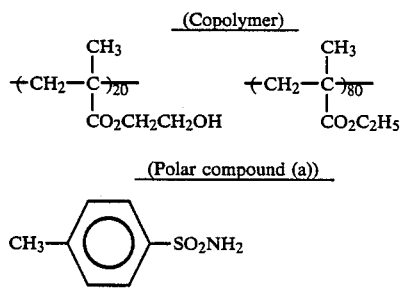

In 18.00 g of the solution was dissolved 0.36 g of Nonion NS-203.5 (tradename of Nippon Oils & Fats Co., Ltd.).

To the resulting solution was added 4.0 g of methylene chloride solution in which 1.29 g of the reducing agent (I) used in Example 1, 1.22 g of the following reducing agent (III) and 0.0015 g of the following antifogging agent were dissolved to obtain an oily phase (O).

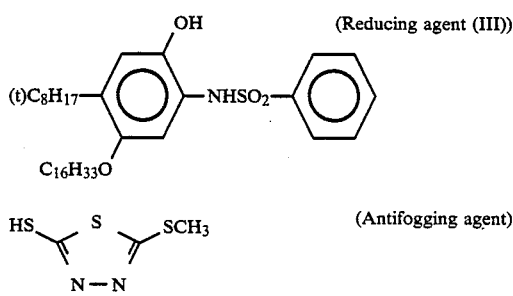

To 2.0 g of the silver halide emulsion was added 0.45 g of 10% aqueous solution of potassium bromide to obtain an aqueous phase (W).

Further, to the oily phase (O) was added the aqueous phase (W), and the mixture was stirred at 15,000 r.p.m. for 5 minutes to obtain W/O emulsion.

Preparation of light-sensitive microcapsule

To 5% aqueous solution of partial sodium salt of polyvinylbenzene sulfonic acid (tradename VERSA TL 500 produced by National Starch, Co.) was added 20% aqueous solution of phosphoric acid, and adjusted to pH 3.5. To the aqueous solution was added the W/O emulsion in which 0.9 g of an adduct of xylene diisocyanate and trimethylolpropane (tradename Takanate D110N produced by Takeda Chemical Industries, Ltd.) was dissolved, and stirred at 7,000 r.p.m. for 30 minutes using homogenizer at 40° C. to obtain an W/O/W emulsion in which oildroplets coated with thin polyurea resin layer were dispersed.

Independently, the mixture of 13.5 g of melamine, 21.6 g of 37% aqueous solution of formaldehyde and 70.8 g of water was stirred at 60° C. for 30 minutes to give a transparent melamine-formaldehyde precondensate.

To the above W/O/W emulsion was added 8.7 g of the precondensate. The mixture was then adjusted to pH 6.0 using 20% aqueous solution of phosphoric acid, and then was stirred for 90 minutes at 60° C. to obtain a dispersion of microcapsules having a shell material comprising polyurea layer on which melamine-formaldehyde resin was deposited.

Preparation of dispersion of base precursor

To 160 g of 1% aqueous solution of gelatin was added 40 g of the following base precursor, and the mixture was dispersed in Dynomill dispersing device to obtain a dispersion of solid particles of base precursor.

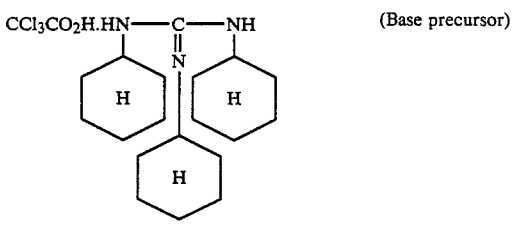

Preparation of light-sensitive material

To 30.0 g of the light-sensitive microcapsule dispersion were added 4.0 g of 5% aqueous solution of Emulex NP-8 (tradename of Nippon Emulsion Co., Ltd.), 17 g of the dispersion of solid particles of base precursor, 4.3 g of 20% aqueous solution of the following polar compound (f) and 3.0 g of 20% aqueous solution of the following polar compound to prepare a coating solution. The coating solution was uniformly coated on the surface of the polyethylene terephthalate film using a wire bar of #40 and dried at 40° C. for 1 hour to obtain a light-sensitive material (G).

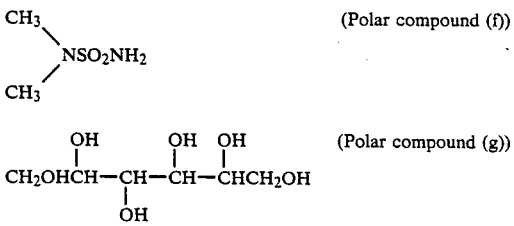

EXAMPLE 4

Preparation of light-sensitive material

Light-sensitive materials (H) to (K) were prepared in the same manner as in Example 3 except that the following polar compounds (b) to (e) were respectively used in the following amount instead of 0.43 g of the polar compound (a).

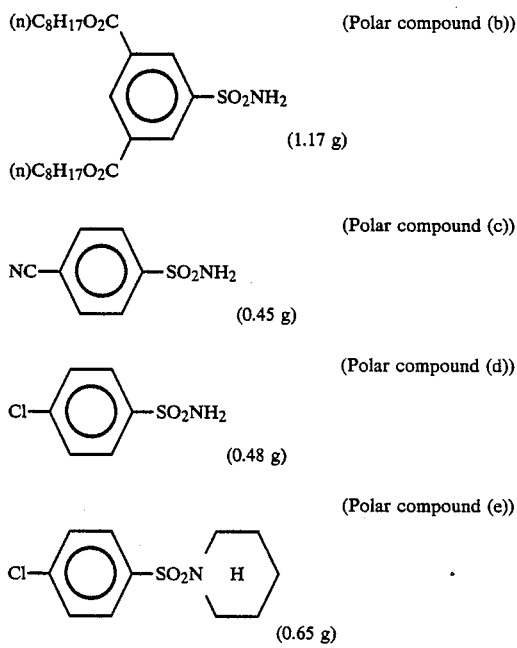

EXAMPLE 5

Preparation of W/O emulsion

In 100 g of trimethylolpropane triacrylate were dissolved 0.4 g of the copolymer used in Example 3 and 10.0 g of Pargascript Red I-6-B (tradename of Chiba-Geigy).

In 18.00 g of the solution was dissolved 0.36 g of Nonion NS-203.5 (tradename of Nippon Oils & Fats Co., Ltd.).

To the resulting solution was added 4.0 g of methylene chloride solution in which 1.29 g of the reducing agent (I) used in Example 1, 1.22 g of the reducing agent (III) used in Example 3 and 0.0015 g of the antifogging agent used in Example 3 were dissolved to obtain an oily phase (O).

To 2.0 g of the silver halide emulsion prepared in Example 3 were added 0.45 g of 10% aqueous solution of potassium bromide and 0.05 g of the polar compound (f) to obtain an aqueous phase (W).

Further, to the oily phase (O) was added the aqueous phase (W), and the mixture was stirred at 15,000 r.p.m. for 5 hours to obtain W/O emulsion.

Preparation of light-sensitive material

A light-sensitive material (L) was prepared in the same manner as in Example 3 except that the above prepared W/O emulsion was used.

EXAMPLE 6

Preparation of light-sensitive material

A light-sensitive material (Y) was prepared in the same manner as in Example 3 except that 0.43 g of the polar compound (a) was not used.

Each of pKa values of the components contained in each of the light-sensitive materials prepared in Examples 3 to 5 and Comparison Example 2 are set forth in Table 3. The pKa value is measured using N,N-dimethylylformamide as the solvent.

TABLE 3

| Component | pKa value |
|---|---|
| Base (formed from base precursor) | 16.8 |
| Polar compound (a) | 15.8 |
| Polar compound (b) | 13.2 |
| Polar compound (c) | 14.0 |
| Polar compound (d) | 15.3 |
| Polar compound (e) | not dissociate |
| Polar compound (f) | 14.3 |
| Reducing agent (II) | 10.0 |

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. The mixture was then uniformly coated on a paper having basis weight of 80 g/m² to give a layer having a wet thickness of 30 μm and dried to obtain an image-receiving material.

Evaluation of light-sensitive material

Each of the light-sensitive materials prepared in Examples 3 to 6 was imagewise exposed to light using a tungsten lamp at 2,000 lux for 1 second through a filter having a maximum density of 4.0 and minimum density 0.1, and then heated on a hot plate at 140° C.

Each of the exposed and heated light-sensitive materials was then combined with the image-receiving material and passed through press rolls at pressure of 500 kg/cm². As a result, a clear magenta positive image was obtained on the image receiving material from each of the light-sensitive materials. The minimum density of the obtained magenta color image was measured using a reflection densitometer to evaluate the rate of the developing reaction.

The results are set forth in Table 4.

In Table 4, "Inside" or "Outside" of the polar compound represents the polar compound contained in microcapsules or polar compound arranged outside of microcapsules.

TABLE 4

| Light-sensitive Material | Polar Compound Inside | Polar Compound Outside | Heating Time (Seconds) 10 | 20 | 30 | 40 |
|---|---|---|---|---|---|---|
| (G) | (a) | (f) | 1.20 | 0.10 | 0.09 | 0.08 |
| (H) | (b) | (f) | 1.20 | 0.15 | 0.12 | 0.10 |
| (I) | (c) | (f) | 1.21 | 0.18 | 0.10 | 0.10 |
| (J) | (d) | (f) | 1.23 | 0.14 | 0.11 | 0.09 |

TABLE 4-continued

| Light-sensitive Material | Polar Compound Inside | Polar Compound Outside | Heating Time (Seconds) 10 | 20 | 30 | 40 |
| --- | --- | --- | --- | --- | --- | --- |
| (K) | (e) | (f) | 1.20 | 0.49 | 0.18 | 0.10 |
| (L) | (f) | (f) | 1.22 | 0.12 | 0.10 | 0.09 |
| (Y) | — | (f) | 1.25 | 1.22 | 0.45 | 0.20 |

It is apparent from the results set forth in Table 4, the light-sensitive materials containing a polar compound in the microcapsules need a short developing time (approx. 30 seconds) for the polymerization reaction and can give a clear image having a low minimum density. Further, the light-sensitive materials (G) to (J) and (L) containing the dissociation type polar compound in the microcapsules need a very short developing time in a very short developing time (approx. 20 seconds) for the polymerization reaction.

EXAMPLE 7

Preparation of light-sensitive material

To 30 g of the microcapsule dispersion prepared in Example 3 was added 4.0 g of 5% aqueous solution of Emulex NP-8 (tradename of Nippon Emulsion Co., Ltd.), 17 g of the dispersion of solid particles of base precursor and 12 g of the dispersion of solid particles of polar compound (a). The mixture was coated on a surface of the polyethylene terephthalate film using a wire bar of #40 dried at 40° C. for 1 hour to obtain a light-sensitive material (M).

EXAMPLE 8

Preparation of light-sensitive material

Light-sensitive materials (N) to (P) were prepared in the same manner as in Example 7 except that each of the polar compounds (c) to (e) was used instead of 12 g of the polar compound (a), and the amount of the polar compounds (c) to (e) was changed as shown in Table 5.

TABLE 5

| Light-sensitive material | Hot-melt compound | Amount (g) Preparation of W/O emulsion | Amount (g) Preparation of light-sensitive material |
| --- | --- | --- | --- |
| (M) | (a) | 0.43 | 12 |
| (N) | (c) | 0.45 | 12 |
| (O) | (d) | 0.48 | 12 |
| (P) | (e) | 0.65 | 12 |

COMPARISON EXAMPLE 2

Preparation of light-sensitive material

A light-sensitive material (Q) was prepared in the same manner as the preparation of the light-sensitive material (M) in Example 8, except that the dispersion of solid particles of the polar compound (a) was not used.

COMPARISON EXAMPLE 3

Preparation of light-sensitive material

A light-sensitive material (R) was prepared in the same manner as the preparation of the light-sensitive material (P) in Example 8 except that the dispersion of solid particles of polar compound (e) was not used.

EXAMPLE 9

Preparation of light-sensitive material

A light-sensitive material (S) was prepared in the same manner as the preparation of the W/O emulsion in Example 7, except that the polar compound (a) was not used.

EXAMPLE 10

Preparation of light-sensitive material

A light-sensitive material (T) was prepared in the same manner as the preparation of the W/O emulsion in Example 8 except that the polar compound (e) was not added.

COMPARISON EXAMPLE 4

Preparation of light-sensitive material

A light-sensitive material (Z) was prepared in the same manner as in Example 7 except that the polar compound (a) was not used in the preparation of the W/O emulsion and the dispersion of solid particles of the polar compound (a) was not used in the preparation of the light-sensitive material (M).

Evaluation of the light-sensitive material

Each of the light-sensitive materials prepared in Examples 7 to 10 and Comparison Examples 2 to 4 was exposed and image was formed on the image-receiving material as in Examples 3 to 5, and the developing process was evaluated per heating time.

The results are set forth in Table 6.

In Table 6, "Inside" or "Outside" has the same meanings as in Table 4.

TABLE 6

| Light-sensitive Material | Polar Compound Inside | Polar Compound Outside | Heating Time (Seconds) 10 | 20 | 30 |
| --- | --- | --- | --- | --- | --- |
| (M) | (a) | (a) | 1.22 | 0.10 | 0.08 |
| (N) | (c) | (c) | 1.23 | 0.15 | 0.10 |
| (O) | (d) | (d) | 1.21 | 0.18 | 0.10 |
| (P) | (e) | (e) | 1.22 | 0.25 | 0.12 |
| (Q) | (a) | — | 1.22 | 0.55 | 0.21 |
| (R) | (e) | — | 1.21 | 0.61 | 0.25 |
| (S) | — | (a) | 1.24 | 0.49 | 0.20 |
| (T) | — | (e) | 1.20 | 0.58 | 0.23 |
| (Z) | — | — | 1.21 | 1.20 | 1.00 |

It is apparent from the results set forth in Table 6, the light-sensitive materials containing a polar compound in the microcapsules need a short developing time (approx. 30 seconds) for the polymerization reaction and can give a clear image having a low minimum density. Further, the light-sensitive materials (M) to (O) containing the dissociation type polar compound in the microcapsules need a very short developing time (approx. 20 seconds) for the polymerization reaction.

I claim:

1. A light-sensitive material comprising a support and a light-sensitive layer containing silver halide, a reducing agent, an ethylenically unsaturated polymerizable compound and a base or base precursor, said silver halide, reducing agent and polymerizable compound being contained in microcapsules which are dispersed in the light-sensitive layer, and said base or base precursor being arranged outside of the microcapsules, wherein the light-sensitive layer contains a polar compound having a melting point in the range of 30° to 250° C., said polar compound being arranged inside and outside of the microcapsules, and said polar compound arranged outside of the microcapsules is present in an amount of from 3 to 30 weight percent and wherein the reducing agent, the polar compound contained in the microcapsules, the polar compound arranged outside of the microcapsules and the base or a base formed from the base precursor have pKa values satisfying the conditions of the formulas (V) and (VI):

$$D \leqq E \leqq G \quad (V)$$

$$D \leqq F \leqq G \quad (VI)$$

in which D represents the pKa value of the reducing agent; E represents the pKa value of the polar compound contained in the microcapsules; F represents the pKa value of the polar compound arranged outside of the microcapsules; and G represents the pKa value of the base or a base formed from the base precursor and wherein said microcapsules contain said polar compound in an amount of from 0.1 to 1.0 mole based on one mole of the reducing agent.

2. The light-sensitive material as claimed in claim 1, wherein the polar compound arranged outside of the microcapsules has a melting point in the range of 50° to 150° C.

3. The light-sensitive material as claimed in claim 1, wherein the polar compound contained in the microcapsules has a melting point in the range of 50° to 150° C.

4. The light-sensitive material as claimed in claim 1, wherein the polar compound arranged outside of the microcapsules is a compound selected from the group consisting of a carboxylic acid amide derivative, a sulfonamide derivative, a phosphoric acid amide derivative, a ketone, an ester, an ether, an urea derivative, an urethane and a compound having hydroxyl group.

5. The light-sensitive material as claimed in claim 1, wherein the polar compound contained in the microcapsules is a compound selected from the group consisting of a carboxylic acid amide derivative, a sulfonamide derivative, a phosphoric acid amide derivative, a ketone, an ester, an ether, an urea derivative, an urethane and a compound having hydroxyl group.

6. The light-sensitive material as claimed in claim 1, wherein the polar compound contained in the microcapsules is a sulfonamide derivative.

7. The light-sensitive material as claimed in claim 1, wherein the polar compound contained in the microcapsules is a sulfonamide derivative having the formula (II):

$$R^4-SO_2NH_2 \quad (II)$$

in which $R^4$ is a monovalent group selected from the group consisting of an alkyl group, a cycloalkyl group, an alkenyl group, an alkinyl group, amino, an aryl group, an aralkyl group and a heterocyclic group, and each of which may have one or more substituent groups.

8. The light-sensitive material as claimed in claim 1, wherein the light-sensitive layer contains a color image forming substance.

* * * * *